United States Patent
Kaukovuori et al.

(10) Patent No.: US 8,085,096 B2
(45) Date of Patent: Dec. 27, 2011

(54) APPARATUS AND METHOD FOR IMPROVED AMPLIFIER SHUNT-PEAK LOADING

(75) Inventors: Jouni Kaukovuori, Vantaa (FI); Jussi Ryynanen, Vantaa (FI)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 12/520,015

(22) PCT Filed: Dec. 22, 2006

(86) PCT No.: PCT/EP2006/012451
§ 371 (c)(1),
(2), (4) Date: Nov. 13, 2009

(87) PCT Pub. No.: WO2008/077417
PCT Pub. Date: Jul. 3, 2008

(65) Prior Publication Data
US 2010/0097140 A1   Apr. 22, 2010

(51) Int. Cl.
H03F 3/191 (2006.01)
H03F 3/68 (2006.01)
H03F 3/45 (2006.01)
(52) U.S. Cl. .................... 330/302; 330/310; 330/252
(58) Field of Classification Search .................. 330/302, 330/310, 311, 252
See application file for complete search history.

(56) References Cited

U.S. PATENT DOCUMENTS

| | | | | |
|---|---|---|---|---|
| 3,122,692 A | * | 2/1964 | Wattson et al. | 318/747 |
| 4,321,553 A | * | 3/1982 | Wagner | 330/265 |
| 4,764,736 A | * | 8/1988 | Usui et al. | 330/294 |
| 6,624,699 B2 | | 9/2003 | Yin et al. | 330/260 |

OTHER PUBLICATIONS

A. Ismail et al., "A 3 to 10GHz LNA Using a Wideband LC-Ladder Matching Network", ISSCC Digest of Technical Papers, Feb. 18, 2004.
S. Mohan et al., "Bandwidth Extension in CMOS with Optimized On-Chip Inductors", IEEE Journal of Solid-State Circuits, vol. 35, No. 3, Mar. 2000.
G. Retz et al., "A CMOS Up-Conversion Receiver Front-End for Cable and Terrestrial DTV Applications", ISSCC 2003, Feb. 12, 2003.
S. Chen et al., "An Integrated CMOS Low Noise Amplifier for Ultra Wide Band Applications", 2005 International Conference on Wireless Networks, Communications and Mobile Computing pp. 1354-1357.
C. Lee et al., "A 1.2V, 18mW, 10Gb/s SiGe Transimpendance Amplifier", 2004 IEEE Asia-Pacific Conference on Advanced System Integrated Circuits (AP-ASIC2004)/Aug. 4-5, 2004.
C. Wu et al, "CMOS Wideband Amplifiers Using Multiple Inductive-Series Peaking Technique", IEEE Journal of Solid-State Circuits, vol. 40, No. 2, Feb. 2005.
T. Toifl et al. "A 23 CHz Differential Amplifier with Monolithically Integrated T-Coils in 0.09μm CMOS Technology", 2003 IEEE MTT-S Dilest, TU4C-2.
A. Bevilacqua et al., "An Ultra-Wideband CMOS LNA for 3.1 to 10.6GHz Wireless Receivers",2004 IEEE International Solid-State Circuits Conference, Jun. 2004.

* cited by examiner

Primary Examiner — Steven J Mottola
(74) Attorney, Agent, or Firm — Harrington & Smith

(57) ABSTRACT

An amplification apparatus comprising first amplification circuitry having first shunt-peak circuitry and second amplification circuitry having second shunt-peak circuitry, wherein the amplification apparatus is arranged to provide an operational bandwidth over which the first and second amplification circuitry amplify signals, and wherein the second shunt-peak circuitry is arranged to use at least part of the first shunt-peak circuitry.

11 Claims, 6 Drawing Sheets

APPARATUS AND METHOD FOR IMPROVED AMPLIFIER SHUNT-PEAK LOADING

RELATED APPLICATION

This application was originally filed as PCT Application No. PCT/EP2006/012451 filed Dec. 22, 2006.

BACKGROUND

The invention relates to an amplification apparatus and a method of amplification.

A low-noise amplifier for ultra-wideband applications may include two cascaded amplifiers each having a shunt-peak load. As a shunt-peak load is utilized in the second amplifier, an additional load inductor is needed, which consumes significant silicon area compared to transistors and other passive components.

The second stage may omit the inductor, in which case the structure suffers from a poorer frequency response.

The listing or discussion of a prior-published document in this specification should not necessarily be taken as an acknowledgement that the document is part of the state of the art or is common general knowledge.

SUMMARY

According to a first aspect, there is provided an amplification apparatus comprising first amplification circuitry having first shunt-peak circuitry and second amplification circuitry having second shunt-peak circuitry, wherein the amplification apparatus is arranged to provide an operational bandwidth over which the first and second amplification circuitry amplify signals, and wherein the second shunt-peak circuitry is arranged to use at least part of the first shunt-peak circuitry.

The part of the first shunt-peak circuitry used by the second shunt-peak circuitry may comprise an inductive element.

The first shunt peak circuitry may comprise a first load path having a first resistive element in series with an inductive element, and the second shunt-peak circuitry may comprise a second load path having a second resistive element in series with the inductive element of the first shunt-peak circuitry.

The first and second load paths may be arranged to couple respective outputs of the first and second amplification circuitry to a voltage supply.

The first shunt-peak circuitry may include a first capacitive element and the second shunt-peak circuitry may include a second capacitive element.

The first capacitive element may be arranged to be in shunt with the first load path, and the second capacitive element may be arranged to be in shunt with the second load path.

The first capacitive element may be arranged to couple an output of the first amplification circuitry to a voltage supply, and the second capacitive element may be arranged to couple an output of the second amplification circuitry to the voltage supply.

The first amplification circuitry may comprise part of one of a positive or negative side of a differential amplifier and the second amplification circuitry may comprise part of the other of the positive and negative side of the differential amplifier.

According to a second aspect, there is provided a method of amplification comprising using first and second shunt-peak circuitry and first and second amplification circuitry to provide an operational bandwidth; and using at least part of the first shunt-peak circuitry in the second shunt-peak circuitry.

According to a third aspect, there is provided an amplification apparatus comprising first means for amplification having first means for shunt-peaking and second means for amplification having second means for shunt-peaking, wherein the amplification apparatus is arranged to provide an operational bandwidth over which the first and second means for amplification amplify signals, and wherein the second means for shunt-peaking is arranged to use at least part of the first means for shunt-peaking.

According to a fourth aspect, there is provided a method of amplification comprising a step for using first and second amplification circuitry and first and second shunt-peak circuitry to amplify signals over an operational bandwidth; and a step for using at least part of the first shunt-peak circuitry in the second shunt-peak circuitry.

The present invention includes one or more aspects, embodiments or features in isolation or in various combinations whether or not specifically stated (including claimed) in that combination or in isolation.

The above summary is intended to be merely exemplary and non-limiting.

BRIEF DESCRIPTION OF THE DRAWINGS

A description is now given, by way of example only, with reference to the accompanying drawings, in which.

DETAILED DESCRIPTION

Figure 1A:
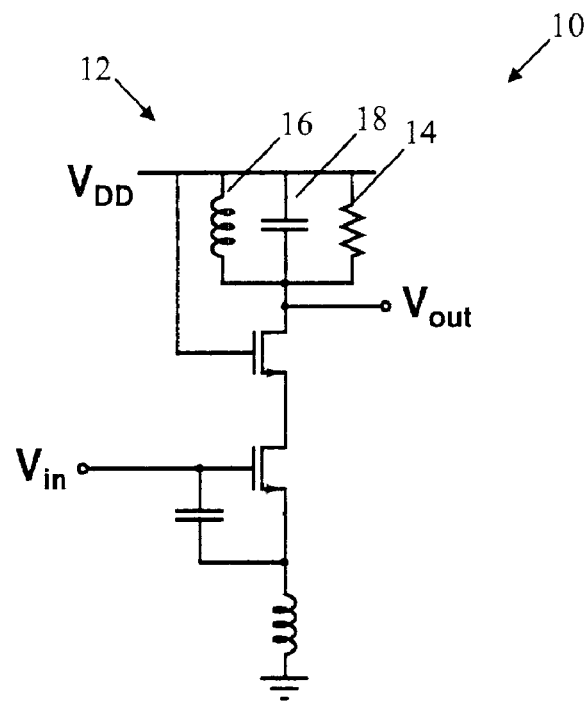
FIG. 1A shows a circuit diagram of a low-noise amplifier with a resonant load.
Figure 1B:
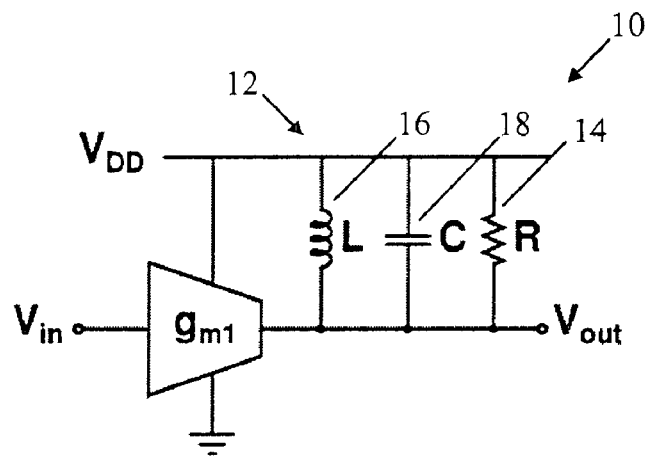
FIG. 1B shows an equivalent circuit of the amplifier of FIG. 1A.

FIGS. 1A and 1B show an inductively-degenerated low-noise amplifier 10 with a resonant load 12.

The resonant load 12 of the low-noise amplifier includes a resistor 14, an inductor 16 and a capacitor 18. The resonant frequency is set by the inductor 16 and the capacitor 18. The −3 dB bandwidth is typically a few hundred MHz, and depends on the impedance level of the resonant load 12, which is defined by the value of the resistor 14. The bandwidth can be increased by lowering the value of the resistor 14.

The operational bandwidth of the resonant load 12 is too narrow for wideband applications like ultra wide band (UWB). For that reason, a shunt-peak load 22 shown in FIG. 2 may be used. The shunt-peak load 22 includes a first path 24 coupling an output node 26 of the amplifier 20 to a voltage supply 28, the first path 24 including a resistor 30 and an inductor 32 connected in series, and a second path 34 coupling the output node 26 to the voltage supply 28, the second path 34 including a capacitor 36. The operation of the shunt-peak load 22 is optimized by choosing appropriate values of the resistor 30 and the inductor 32.

The capacitor 36 represents all the capacitive loading on the output node 26. The maximum operational frequency is limited by the pole formed by the resistor 30 and the capacitor 36. The value of the resistor 30 cannot be too large in order to avoid degrading the maximum operational frequency. Therefore, the impedance level of the shunt-peak load 22 is limited. In modern deep sub-micron CMOS processes, the self-gain of a single transistor is low. As a result, the voltage gain achieved from a single amplifier stage with a shunt-peak load 22 is lower than a narrowband amplifier with an RLC resonator, for example. Therefore, a second amplifier stage is required to achieve adequate gain or signal swing, as shown in FIGS. 3 and 4.

Figure 2:
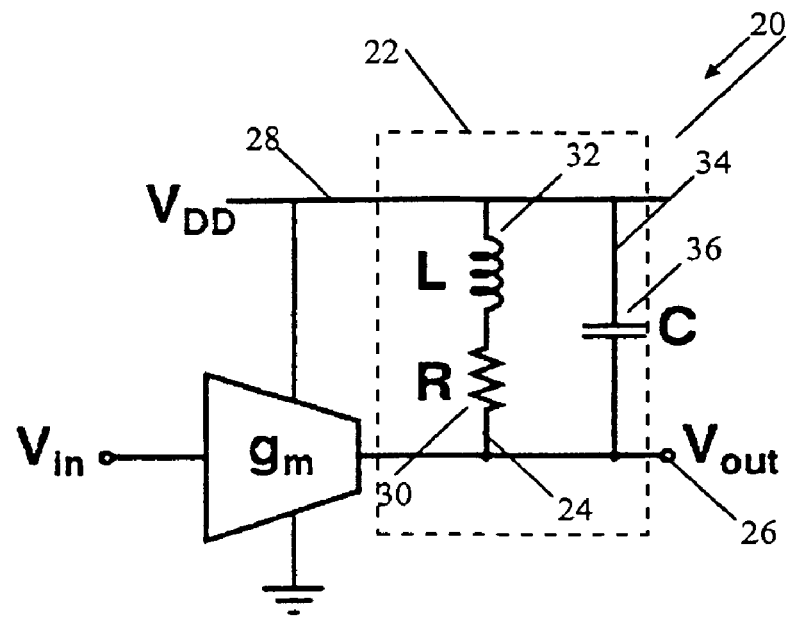
FIG. 2 shows an equivalent circuit of an amplifier with a shunt-peak load.
Figure 3:
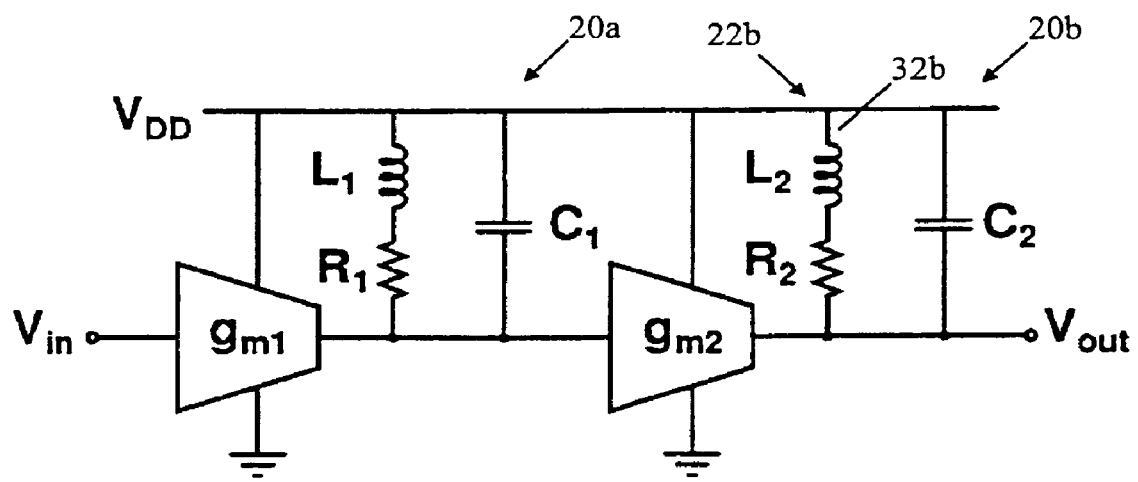
FIG. 3 shows an equivalent circuit of two cascaded amplifiers of the type shown in FIG. 2.

FIG. 3 shows two cascaded amplifiers 20a, 20b of the type shown in FIG. 2. As a shunt-peak load 22b is utilized in the second amplifier 20b, an additional load inductor 32b is needed, which consumes significant silicon area compared to transistors and other passive components. The area of the integrated circuit (IC) may be approximately double the area of the integrated circuit for the amplifier 20 of FIG. 2.

Figure 4:
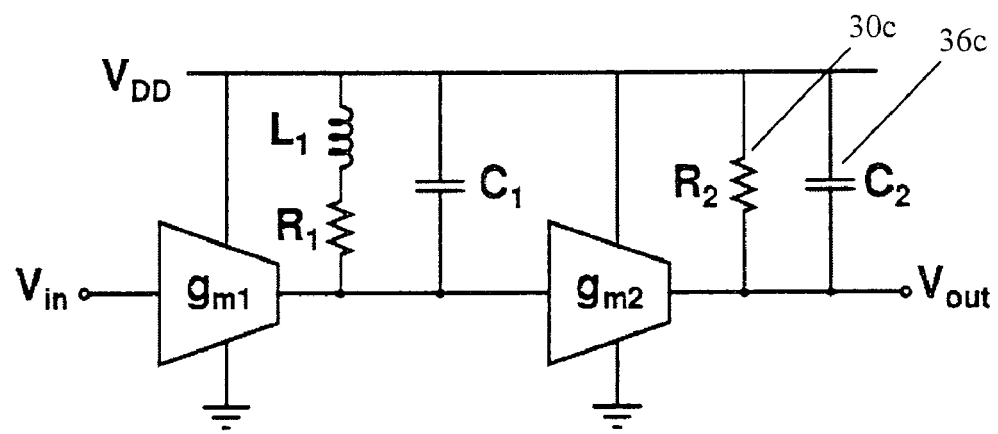
FIG. 4 shows an equivalent circuit of an amplifier in which a first stage has a shunt-peak load and a second stage has an RC load.

Alternatively, the second stage may omit the inductor, as shown in FIG. 4. This structure suffers from a poorer frequency response than a basic shunt-peak load with similar values of the resistor 30c and capacitor 36c.

Figure 5:
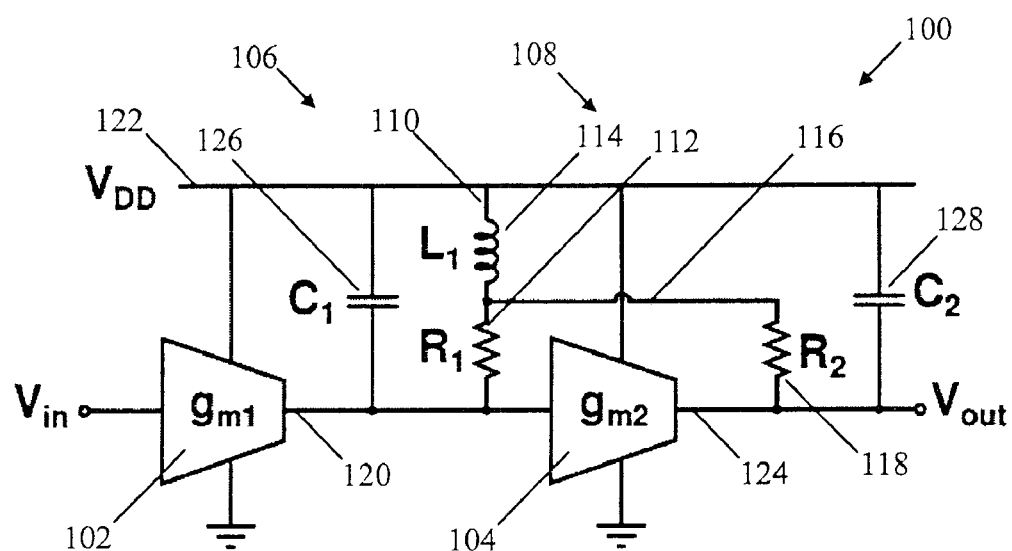
FIG. 5 shows an equivalent circuit of an amplification apparatus with a shared shunt-peak load.

FIG. 5 shows an equivalent circuit of an amplification apparatus 100 with a shared shunt-peak load.

The amplification apparatus 100 comprises first amplification circuitry 102 having first shunt-peak circuitry 106 and second amplification circuitry 104 having second shunt-peak circuitry 108. The first and second shunt-peak circuitry 106, 108 are arranged to maximise an operational bandwidth of the first and second amplification circuitry 102, 104.

The first shunt peak circuitry 106 comprises a first load path 110 having a first resistive element 112 in series with an inductive element 114. The second shunt-peak circuitry 108 comprises a second load path 116 having a second resistive element 118 in series with the inductive element 114 of the first shunt-peak circuitry 106. The first load path 110 is arranged to couple an output 120 of the first amplification circuitry 102 to a voltage supply 122. The second load path 116 is arranged to couple an output 124 of the second amplification circuitry 104 to the voltage supply 122. The first shunt-peak circuitry 106 includes a first capacitive element 126 and the second shunt-peak circuitry 108 includes a second capacitive element 128. The first capacitive element 126 is arranged to be in shunt with the first load path 110, and the second capacitive element 128 is arranged to be in shunt with the second load path 116. The first capacitive element 126 is arranged to couple the output 120 of the first amplification circuitry 102 to the voltage supply 122, and the second capacitive element 128 is arranged to couple the output 124 of the second amplification circuitry 104 to the voltage supply 122.

In this way, the second shunt-peak circuitry 108 is arranged to use the inductive element 114 of the first shunt-peak circuitry 106. This has two major benefits. Firstly, the arrangement results in a wider operational bandwidth and increased gain compared to the single-stage amplifier with a shunt-peak load of FIG. 2. Secondly, an additional inductor is not required. Thus, the silicon area required by the second amplifier stage does not significantly increase the overall layout area.

Figure 6:
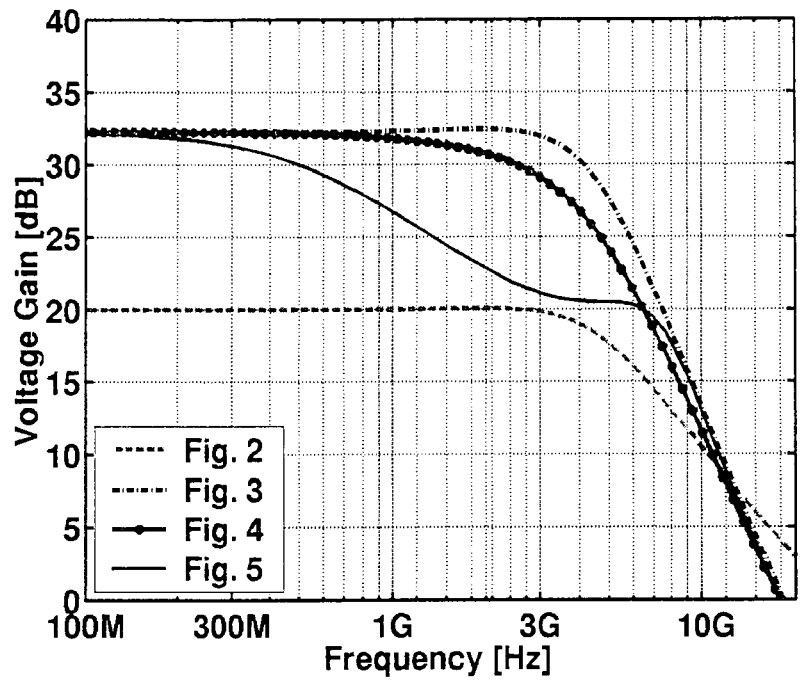
FIG. 6 shows how the voltage gain (in dB) of the amplifiers of FIGS. 2 to 5 varies with frequency.

FIG. 6 shows how the voltage gain (in dB) of the amplifiers of FIGS. 2 to 5 varies with frequency.

The amplification apparatus 100 of FIG. 5 has a low-frequency pole as is shown in FIG. 6. In addition, there is a zero at higher frequency, which cancels the effect of the low-frequency pole and leads to a flat gain response at a specific frequency area of several GHz.

The flat area particularly extends the bandwidth compared to that of a single-stage amplifier with a shunt-peak load, like the amplifier shown in FIG. 2. An increase in gain is also achieved. Because the physical size of the transistors and resistors of the second amplifier stage are significantly smaller than the layout size of an inductor, the gain/bandwidth improvement is achieved without penalty of significant increase in layout area.

Figure 7:
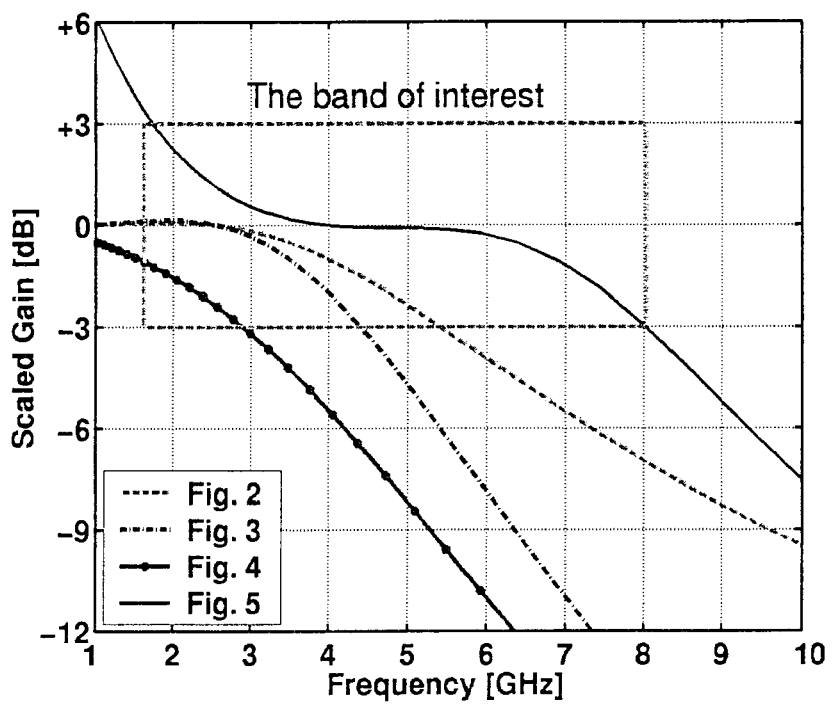
FIG. 7 shows part of FIG. 6 with the voltage gain scaled.
Figure 8:
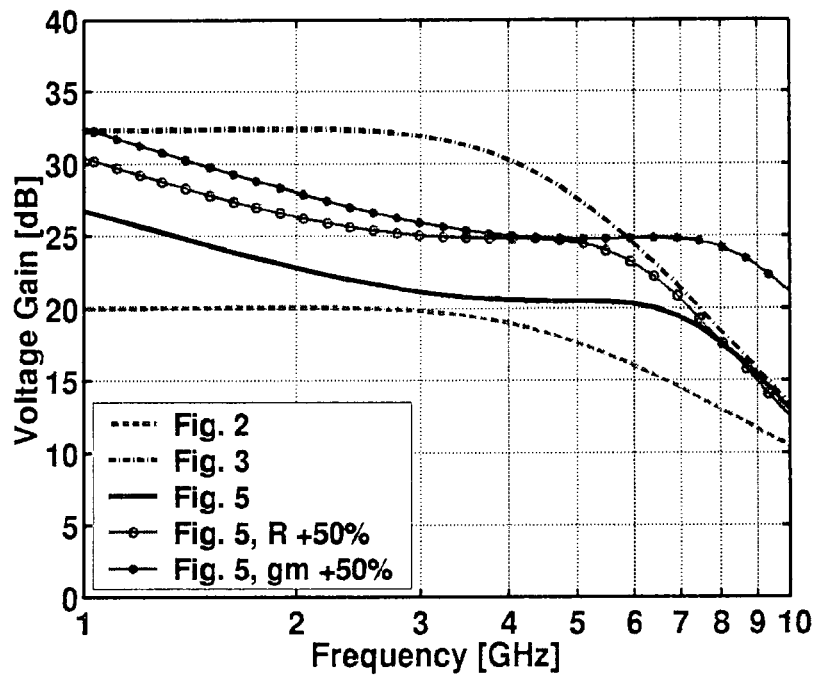
FIG. 8 shows part of FIG. 6 with additional traces for variations in parameters of the amplification apparatus of FIG. 5.

Compared to the amplifiers of FIGS. 3 and 4, the amplification apparatus 100 provides lower gain at high frequencies with identical component values, as is shown in FIG. 6. When the gain responses of the amplifiers of FIGS. 2 to 5 are scaled to 0 dB at the band of interest, the amplification apparatus 100 has the highest −3 dB cut-off frequency, as shown in FIG. 7. In addition, the high-pass frequency of the amplification apparatus 100 can be traded for higher gain at the flat frequency area by increasing the values of the resistive elements 112, 118, as shown in FIG. 8. Furthermore, if the gains ($g_m$) of the first and second amplification circuitry 102, 104 are increased, both the gain and bandwidth are increased.

Thus, the amplification apparatus 100 provides improved overall performance of an amplifier in a case in which wide operational bandwidth is required but the number of on-chip inductors may not be increased.

Figure 9:
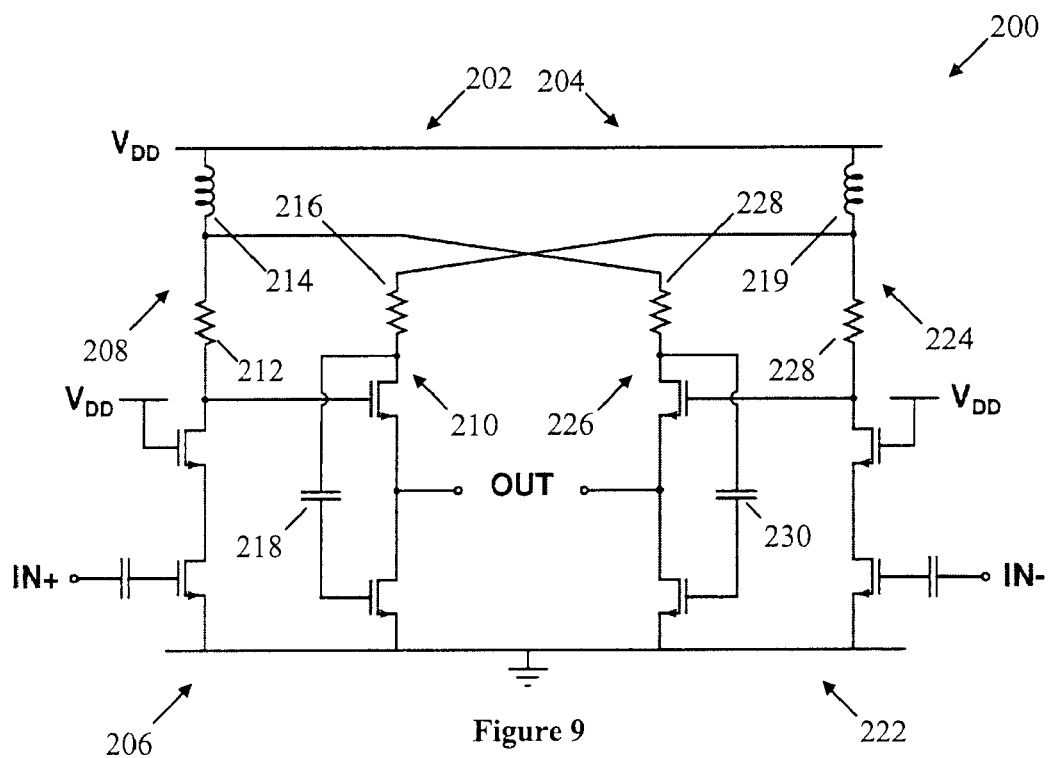
FIG. 9 shows a differential amplification apparatus with a shared shunt-peak load.

FIG. 9 shows a differential amplification apparatus 200 with a shared shunt-peak load. The apparatus 200 includes a positive side 202 and a negative side 204.

The positive side 202 includes amplification circuitry 206, first shunt-peak circuitry 208 and second shunt-peak circuitry 210. The first shunt-peak circuitry 208 includes a resistive element 212 in series with an inductive element 214. The second shunt-peak circuitry 210 includes a resistive element 216 and a capacitive element 218. The resistive element 216 of the second shunt-peak circuitry 210 is coupled to an inductive element 219 of the first shunt-peak circuitry 220 of the negative side 204.

The negative side 204 includes amplification circuitry 222, first shunt-peak circuitry 224 and second shunt-peak circuitry 226. The first shunt-peak circuitry 224 includes a resistive element 228 in series with the inductive element 219. The second shunt-peak circuitry 226 includes a resistive element 228 and a capacitive element 230. The resistive element 228 of the second shunt-peak circuitry 226 is coupled to the inductive element 214 of the first shunt-peak circuitry 206 of the positive side 202.

The amplification apparatus 200 is intended for use as a local oscillator buffer in an ultra-wideband receiver. Because of a 180-degree phase shift between the positive and negative sides, the shunt-peak circuitry of the positive side is cross-connected to the shunt-peak circuitry of the negative side.

In a variant, the two inductive elements 214, 218 may be part of a single differential inductor.

Figure 10:
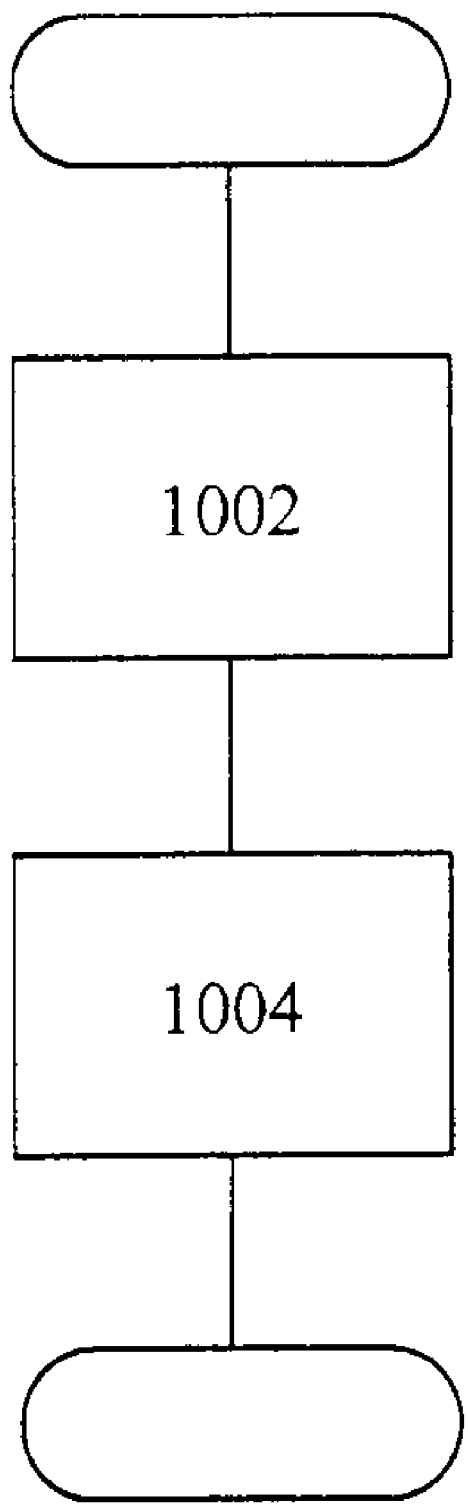
FIG. 10 shows a flowchart representing a method.

FIG. 10 shows a flowchart representing a method of amplification comprising (1002) using first shunt-peak circuitry and second shunt-peak circuitry to maximise an operational bandwidth of first amplification circuitry and second amplification circuitry, and (1004) using at least part of the first shunt-peak circuitry in the second shunt-peak circuitry.

The invention is applicable to radio receivers, integrated circuits, low-noise amplifiers, buffers, and applications with wideband operational bandwidth, for example wideband code division multiple access (WCDMA), ultra-wideband (UWB) and wireless local area network (WLAN) systems. It should be noted that the invention is not limited only to complementary metal oxide silicon (CMOS) low-noise amplifiers, and can be utilized in all two-stage amplifiers, for example local oscillator (LO) buffers and various semiconductor technologies, for example, in bipolar junction transistor (BJT) technology.

It will be appreciated that the aforementioned circuitry may have other functions in addition to the mentioned functions, and that these functions may be performed by the same circuit.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

While there have been shown and described and pointed out fundamental novel features of the invention as applied to preferred embodiments thereof, it will be understood that various omissions and substitutions and changes in the form and details of the devices and methods described may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto. Furthermore, in the claims means-plus-function clauses are intended to cover the structures described herein as performing the recited function and not only structural equivalents, but also equivalent structures. Thus although a nail and a screw may not be structural equivalents in that a nail employs a cylindrical surface to secure wooden parts together, whereas a screw employs a helical surface, in the environment of fastening wooden parts, a nail and a screw may be equivalent structures.

The invention claimed is:

1. An apparatus comprising:
   first amplification circuitry having first shunt-peak circuitry; and
   second amplification circuitry having second shunt-peak circuitry;
   wherein the second shunt-peak circuitry is arranged to use at least part of the first shunt-peak circuitry;
   and wherein the first shunt-peak circuitry comprises a first load path having a first resistive element in series with an inductive element, wherein the first shunt-peak circuitry comprises a first capacitive element, and wherein the second shunt-peak circuitry comprises a second load path having a second resistive element in series with the inductive element of the first shunt-peak circuitry, wherein the second shunt-peak further comprises a second capacitive element.

2. The apparatus of claim 1 wherein the first and second load paths are arranged to couple respective outputs of the first and second amplification circuitry to a voltage supply.

3. The apparatus of claim 1 wherein the first capacitive element is arranged to be in shunt with the first load path, and the second capacitive element is arranged to be in shunt with the second load path.

4. The apparatus of claim 1 wherein the first capacitive element is arranged to couple an output of the first amplification circuitry to a voltage supply, and the second capacitive element is arranged to couple an output of the second amplification circuitry to the voltage supply.

5. The apparatus of claim 1 wherein the first amplification circuitry comprises part of one of a positive or negative side of a differential amplifier and the second amplification circuitry comprises part of the other of the positive and negative side of the differential amplifier.

6. A method comprising:
   using first and second amplification circuitry and first and second shunt-peak circuitry to amplify signals;
   using at least part of the first shunt-peak circuitry in the second shunt-peak circuitry, the first shunt-peak circuitry comprising a first load path having a first resistive element in series with an inductive element, wherein the first shunt-peak circuitry comprises a first capacitive element, and the second shunt-peak circuitry comprising a second load path having a second resistive element in series with the inductive element of the first shunt-peak circuitry, wherein the second shunt-peak circuitry further comprises a second capacitive element.

7. The method of claim 6 wherein the first and second load paths are arranged to couple respective outputs of the first and second amplification circuitry to a voltage supply.

8. The method of claim 6 wherein the first capacitive element is arranged to be in shunt with the first load path, and the second capacitive element is arranged to be in shunt with the second load path.

9. The method of claim 6 wherein the first capacitive element is arranged to couple an output of the first amplification circuitry to a voltage supply, and the second capacitive element is arranged to couple an output of the second amplification circuitry to the voltage supply.

10. An apparatus comprising:
    first means for amplification having first means for shunt-peaking; and
    second means for amplification having second means for shunt-peaking,
    wherein the second means for shunt-peaking is arranged to use at least part of the first means for shunt-peaking, and wherein the first means for shunt-peaking comprises a first load path means having a first resistive means in series with an inductive means, wherein the first means for shunt-peaking comprises a first capacitive element, and wherein the second means for shunt-peaking comprises a second load path means having a second resistive means in series with the inductive means of the first means for shunt-peaking, wherein the second means for shunt-peaking comprises a second capacitive element.

11. A method comprising:
    using first and second amplification circuitry and first and second shunt-peak circuitry to amplify signals over an operational bandwidth; and
    using at least part of the first shunt-peak circuitry in the second shunt-peak circuitry, the first shunt-peak circuitry comprising a first load path having a first resistive element in series with an inductive element, wherein the first shunt-peak circuitry comprises a first capacitive element, and the second shunt-peak circuitry comprising a second load path having a second resistive element in series with the inductive element of the first shunt-peak circuitry, wherein the second shunt-peak circuitry comprises a second capacitive element.

* * * * *